(12) United States Patent
Spivey

(10) Patent No.: US 6,742,173 B2
(45) Date of Patent: May 25, 2004

(54) COMMUNICATION AND CONTROL MODEL FOR FIELD PROGRAMMABLE GATE ARRAYS AND OTHER PROGRAMMABLE LOGIC DEVICES

(75) Inventor: Gary E. Spivey, Tucson, AZ (US)

(73) Assignee: Rincon Research Corporation, Tucson, AZ (US)

( * ) Notice: Subject to any disclaimer, the term of this patent is extended or adjusted under 35 U.S.C. 154(b) by 0 days.

(21) Appl. No.: 10/175,680

(22) Filed: Jun. 20, 2002

(65) Prior Publication Data

US 2003/0182633 A1 Sep. 25, 2003

Related U.S. Application Data

(60) Provisional application No. 60/366,569, filed on Mar. 22, 2002.

(51) Int. Cl.[7] .............................................. G06F 17/50
(52) U.S. Cl. ......................................... 716/16; 716/4
(58) Field of Search .......................... 716/4–5, 16–18, 716/1; 703/20, 23, 25, 27; 714/725

(56) References Cited

U.S. PATENT DOCUMENTS

| | | | |
|---|---|---|---|
| 5,828,858 A | | 10/1998 | Athanas et al. ............. 710/317 |
| 6,182,258 B1 | * | 1/2001 | Hollander .................... 714/739 |
| 6,216,258 B1 | | 4/2001 | Mohan et al. ................. 716/17 |
| 6,230,307 B1 | | 5/2001 | Davis et al. ................... 716/16 |
| 6,445,974 B1 | * | 9/2002 | Malaugh et al. ............. 700/182 |
| 6,539,522 B1 | * | 3/2003 | Devins et al. .................. 716/5 |
| 6,587,995 B1 | * | 7/2003 | Duboc et al. ................... 716/4 |

* cited by examiner

Primary Examiner—Matthew Smith
Assistant Examiner—Paul Dinh
(74) Attorney, Agent, or Firm—Durando Birdwell & Janke PLC

(57) ABSTRACT

A digital storage medium for use with a computer system for producing a Dynamic Object Model interposed between FPGA hardware (including hardware platforms and FPGAs) and software applications. Hardware functional units are represented by unique Dynamic Objects. Dynamic Objects allow functional units to abstractly advertise their functionality and attributes directly to software applications as objects. Software applications can utilize these abstract functions and set functional unit attributes without specific knowledge of the physical composition of FPGA hardware. A Dynamic Object Model includes a software environment front end program component and a hardware environment back end program component. Additionally, a Dynamic API allows the front end program component to effectively communicate with the back end program component.

31 Claims, 8 Drawing Sheets

COMMUNICATION AND CONTROL MODEL FOR FIELD PROGRAMMABLE GATE ARRAYS AND OTHER PROGRAMMABLE LOGIC DEVICES

RELATED APPLICATION INFORMATION

This application claims the filing date benefit of U.S. Provisional Patent Application Serial No. 60/366,569, filed Mar. 22, 2002, which is incorporated by reference in its entirety for any purpose.

DESCRIPTION OF THE INVENTION

1. Field of the Invention

This invention is related in general to the field of interfacing with programmable logic devices ("PLDs"). In particular, the invention consists of a novel communication and control mechanism for querying the status of and controlling the behavior of field programmable gate array ("FPGA") based systems.

BACKGROUND OF THE INVENTION

Highly demanding computer processing tasks have generally been performed by software applications on general-purpose computers. Often these general-purpose computers are not adequate for the processing requirements of the applications and designers have been forced to employ solutions involving special-purpose hardware. Special-purpose hardware often requires detailed programming and extended effort to take advantage of the unique processing elements they possess. This extra programming effort introduces significant development costs for special purpose processing.

Software applications written in various programming languages such as "C", MATLAB, Python, Midas 2K, and the like can control PLDs. The software applications are run on general purpose processors, special purpose processors, or embedded processors. Some PLDs have inherent microprocessors which run software applications. For example, the VIRTEX II PRO CHIP® FPGA has an embedded POWER PC® processor for running software applications. PLDs are comprised of functional units, each providing a computational function. Some functional units employ large proprietary algorithms called "cores". A core can be treated as a "black box" during a design process, wherein knowledge of a functional unit's behavior is known, but knowledge of the composition of the functional unit is not required. Typically, knowledge of a core's communication path, inputs and outputs, attributes and behavior are necessary to utilize the core.

One method of communicating with functional units and their cores is to use an Application Program Interface ("API"). APIs are software interface constructs that provide specifications of functions provided by hardware devices which can be requested by software applications. However, traditional APIs require software applications to have specific knowledge of detailed functional unit information, such as register addressing, control and status bit information, control access sequences, and functional unit timing diagrams to properly communicate with and control these hardware devices. For example, a software application that attempts to set a frequency attribute of a digital tuner core inside an FPGA would typically need a register address inside the functional unit associated with the frequency attribute. Additionally, the application might also need to access the functional unit via some control sequence that accesses specific bits in a specific control register. A programmer would explicitly indicate the register address in a software application that wishes to set the frequency attribute parameter and then perform the appropriate control sequence to transfer data to this register address. If the register address changes due to a modification of a functional unit or design implementation with a different FPGA design, or the control sequence is altered for similar reasons, the software application would not function properly, as the coded register address no longer points to the frequency attribute register and the control sequence and control information may be different. A programmer would need to modify the programming code for the software application to match these changes in the hardware design.

If a software application requests a function via an API, the function will partition the request into discrete steps that can be performed by the hardware. Only those hardware functions that are described by the API are available to the software application. If a hardware device has additional features or attributes not recognized by the API, they are typically not available for use by the software application.

There has been an attempt to establish an industry standard input/output ("I/O") interface for software applications such that API calls may be uniform. An attempt has also been made to utilize these industry standard I/O interfaces by developing industry standard hardware interfaces. The result is a uniform set of API software calls producing uniform stimulation of hardware devices. This is useful for establishing a standard method of transferring data between software applications and functional units (in the cases above, the drivers will still be different, but encapsulated by these API calls). However, this standard does not provide a method of controlling the attributes of functional units. A change of hardware design would still require a corresponding change in application software.

One patent which discloses attempts to improve on methods of controlling FPGAs is Davis et al. U.S. Pat. No. 6,230,307, entitled SYSTEM AND METHOD FOR PROGRAMMING THE HARDWARE OF FIELD PROGRAMMABLE GATE ARRAYS (FPGAS) AND RELATED RECONFIGURATION RESOURCES AS IF THEY WERE SOFTWARE BY CREATING HARDWARE OBJECTS. Davis discloses a system that controls the behavior of FPGAs as if they are software by creating hardware objects that implement application level functions. Control and execution of hardware objects occurs via high level software constructs. However, a change in a function in an FPGA will necessitate that a new hardware object be created. Thus, every time a design adds or changes an FPGA core, a new hardware object must be written and the software applications must be re-compiled to integrate this new object. This eliminates the need to re-code software applications when designs change, but introduces a requirement of coding new hardware objects to reflect changes to functional units. This patent does not disclose run-time control of functional unit attributes nor does it provide a software object that represents the functional unit hierarchy with attribute control. Run-time reconfiguration is disclosed but not run-time control.

A second patent of interest is Athanas et al. U.S. Pat. No. 5,828,858, entitled WORM-HOLE RUN-TIME RECONFIGURABLE PROCESSOR FIELD PROGRAMMABLE GATE ARRAY (FPGA). Athanas discloses a methodology of using dynamically created operators and pathways to move data between functional units through configurable interconnections. This invention makes use of dynamically changeable variable length data ports. While Athanas discloses a novel approach to interconnecting functional units, it does not address a method of allowing software applications to query these functional units to ascertain their attributes. Nor does Athanas provide a method of controlling functional units without prior detailed knowledge of their attributes.

Another reference is Mohan et al. U.S. Pat. No. 6,216, 258, entitled FPGA MODULES PARAMETERIZED BY EXPRESSIONS. Mohan discloses parameterizing functional modules of target specific FPGAs. This provides a standard method of representing FPGA attributes. While these parameters are visible to high level software applications, applications must still be hard-coded to access these parameters directly.

In the methods discussed, a system designer must have intimate knowledge of underlying hardware in order to effectively integrate the hardware into a given software environment. Therefore, it is desirable to have a method of allowing software applications to communicate with and control hardware functional units without specific and detailed knowledge of a device's parameters and attributes.

It is also desirable to have a method of changing hardware designs without necessitating that software applications be rewritten or re-compiled to integrate these hardware changes.

It is likewise desirable to allow software applications and hardware devices to be designed independently of each other, yet operate in a cohesive manner when integrated.

Previously, software applications controlling FPGA functional units have been designed for specific purposes and for specific software environments. Because system requirements change rapidly and increase in complexity, it is necessary for design solutions to be rapidly portable to new hardware platforms and be integrated into a variety of software application environments. It is desirable that a software interface be developed that allows numerous software applications to communicate with and control numerous hardware devices; adding or changing software applications can be done without affecting communication and control of existing hardware designs.

It is likewise desirable to have a hardware interface wherein numerous hardware devices can be queried and controlled by numerous software applications, and adding or changing hardware devices can be done without affecting communication with software applications.

BRIEF SUMMARY OF THE INVENTION

The present invention meets the aforementioned needs by providing a software interface layer by which software applications may communicate with and control functional units residing in FPGAs or other PLDs without requiring detailed knowledge of associated FPGA hardware. The approach taken by the method of communication and control which is the subject of the present invention is to provide an interface layer between functional units inherent in FPGA hardware (including hardware platforms and FPGAs) and software applications. Each hardware functional unit is represented by a unique but standard Dynamic Object. The purpose of the Dynamic Object is to allow functional units to advertise their functionality and attributes to software applications. Additionally, software applications may utilize this functionality and set functional unit attributes without functional unit specific information such as FPGA hardware, functional unit composition, or functional unit implementation.

The invention described herein is referred to as a Dynamic Object Model. A Dynamic Object Model includes a front end program component, a back end program component, and a dynamic API program component ("contract negotiator") for providing communication between the front end program component and the back end program component.

A Dynamic front end program component is a software construct that includes libraries and supporting files for software environments. A front end may be written to accommodate, for example, "C", Matlab, Midas2k, or Perl software environments. A unique front end is written for each software environment. Changes to the front-end are only required if the dynamic API specification changes. The front end does not require modification when hardware designs are modified, i.e., changing a hardware platform does not require that a Dynamic Object Model front end be re-written.

A contract negotiator program component is a software construct providing a standard for the front end and the back end. A dynamic list of acceptable system calls is established that can be requested by the front end and performed by the back end. The preferred embodiment of the invention implements a fixed API. It is possible, however, to include in the API the ability to dynamically create new calls that can be used by the front-end. For instance, if the back-end creates an object that has a new method, the front-end could generate a method in the Dynamic Object to match it. To dynamically add new methods, the front and back end implementations must have agreement on function prototypes.

A back end is a software construct wherein software drivers are written for specific hardware platforms or software emulators. A hardware platform is a vendor specific circuit board, such as a Starfire FPGA board, designed to accommodate and support FPGAs or other PLDs. The back end incorporates interface information specific to the hardware platform. Once a back end has been written for a specific hardware platform, implementation of a different type of FPGA, changes to a FPGA design, or changes in the implementation of functional units do not require modifying the Dynamic Object Model back end.

The Dynamic Object Model back end produces a dynamic object for each functional unit inside each FPGA or PLD. These dynamic objects encapsulate functional unit specific information such as functionality, timing requirements and functional unit attributes. Using the dynamic API, the back end communicates available functional units and their attributes to the Dynamic Object Model front end as dynamic objects comprised of functions and parameters. The front end makes these dynamic objects available to its software applications.

A popular method of coding software applications is object oriented programming ("OOP"). In the present invention, software applications operate on dynamic objects representing functional units as if they are standard algorithmic objects. Control of functional units is handled by the functional unit specific information encapsulated by the dynamic objects rather than directly by the software applications. Software applications do not require knowledge of a functional unit's function and attributes to implement functions and manipulate the parameters of it representative dynamic object.

Therefore, it is a principal object of this invention to provide a method of allowing software applications to communicate with and control hardware functional units without specific and detailed knowledge of functional unit specific information and attributes.

It is another object of this invention to provide a method of changing hardware designs without requiring that software applications be rewritten or re-compiled to utilize the hardware design changes.

It is yet another object of this invention to allow software applications and hardware systems to be designed independently, yet function cohesively when integrated.

It is a further object of this invention to provide a software environment that allows numerous software applications to communicate with and control numerous functional units and that permits adding or changing software applications without affecting communication and control of existing hardware designs.

An additional object of this invention is to provide a hardware interface wherein numerous hardware devices can be queried and controlled by numerous software applications and wherein adding or changing hardware devices can occur without affecting communication with software applications.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
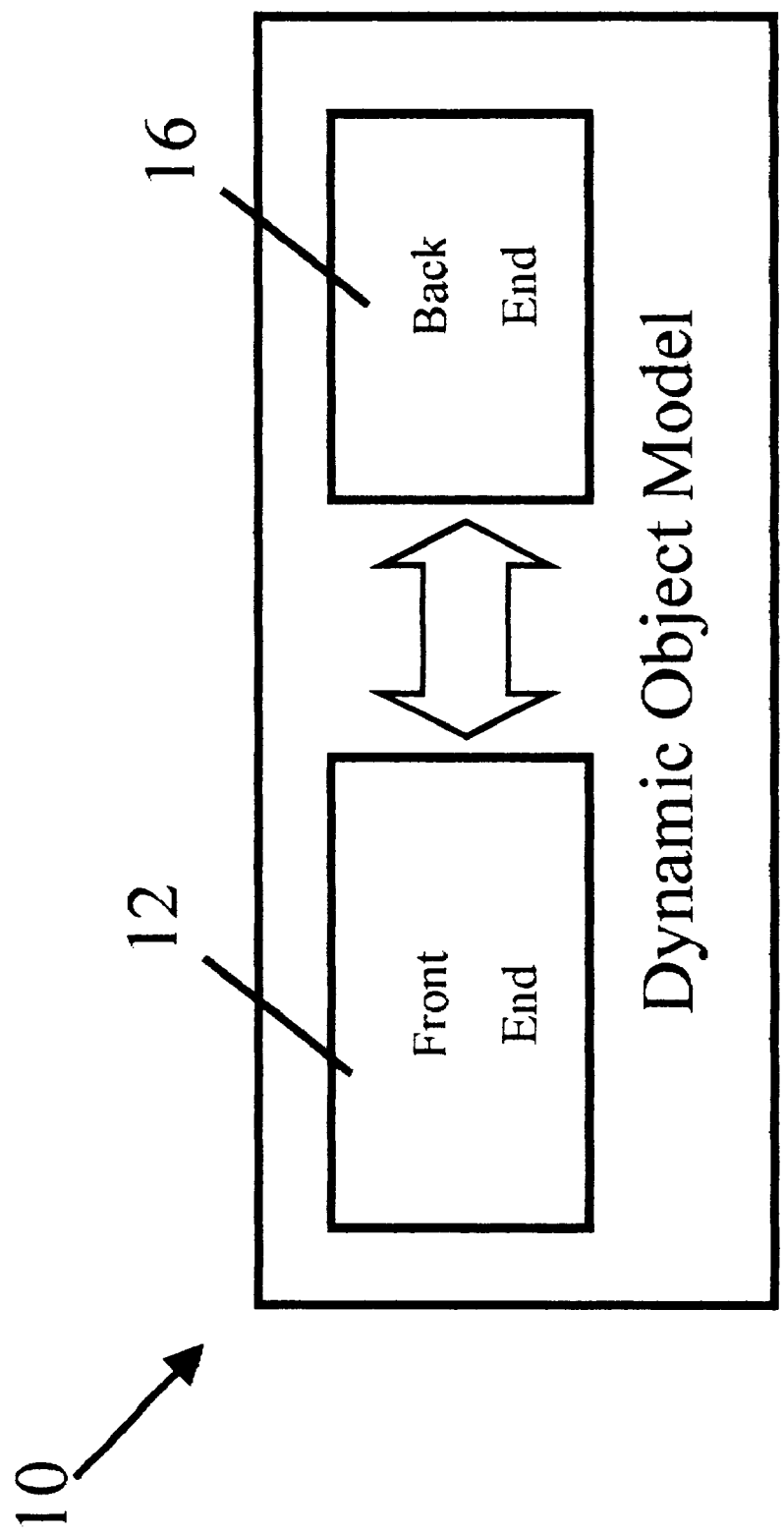
FIG. 1 is a block diagram illustrating the main components of a Dynamic Object Model according to the invention.

A software interface layer 10 referred to as a Dynamic Object Model ("DOM") exemplary of the present invention is shown in FIG. 1. The DOM is comprised of a Dynamic Object Model front end 12 ("front end") and a Dynamic Object Model back end 16 ("back end"). The front end and back end are written to design specifications embodied as a standard. This standard can be user definable and is referred to as a contract negotiator ("contract"). The contract is the standard which defines the acceptable parameters and functions that can be passed between the front end and the back end. The contract can be static, i.e., is set during the design process and does not change during device operation. Or, the contract can be dynamic, i.e., can be changed by either the front end or the back end during operation. The purpose of the DOM is to provide a means of communicating with and controlling hardware devices such as functional units residing within programmable logic devices ("PLDs"). More specifically, the DOM allows software applications to make use of functional unit functionality and set functional unit attributes without possessing detailed information about the composition and operational requirements of the functional unit.

A functional unit is a hardware construct or a software construct designed to perform a task in a computer environment. Functional units can be used to add two numbers together, to filter information, to store data, or perform any of an unlimited number of algorithmic functions. Functional units can be either software constructs or hardware constructs. If a software construct, a functional unit is a software algorithm. If a hardware construct, a functional unit can be an integrated circuit or a collection of physical and electrical connections inside a PLD or inherent in a hardware system such as a commercially available digital tuner. In the preferred embodiment of the present invention, a functional unit is a physical implementation of electrical connections residing in a field programmable gate array ("FPGA") designed to perform a specific task in response to data or control signals. Some functional units have attributes which are used in the performance of their tasks. Some of these attributes can be modified to change the functional behavior of their respective functional units. In most instances, a functional unit has a data interface through which it receives data from or sends data to other functional units or memory devices. Additionally, a functional unit may have a control interface through which control signals direct the activity of the functional unit, set functional unit attributes or query the status of the functional unit or its attributes. These data and control interfaces are connected to external FPGA pins by electrical connections. These electrical connections are abstractly represented as portals and are the only part of an FPGA design which are visible external to the FPGA.

Functional units have physical characteristics that generate operational requirements that must be satisfied in order for the functional unit to operate properly. For example, one requirement may be the amount of time that must be allowed between successive functional operations, a requirement associated with timing delay. Another requirement may be the amount of time necessary to move data within the functional unit or the amount of data that can be stored in a functional unit. For attributes to be set and queried through the control interface, device addressing and memory location information is required. These and other requirements are intimately associated with both the design of the functional unit and the medium in which the functional unit resides. For example, a functional unit which uses a first memory location to store an attribute may be redesigned with the attribute residing at a second memory location. Additionally, a functional unit implemented in a FPGA may be re-implemented in a newer, faster or bigger FPGA resulting in different timing requirements. Prior to the present invention, software applications wishing to direct the behavior of these functional units had to have intimate knowledge about the physical requirements and design implementation of these functional units. It was necessary to program this information into software applications wishing to make use of the functional unit in the form of unique driver calls parameters and system access methodologies.

While functional units reside in PLDs such as FPGAs, FPGAs in turn reside on specific hardware platforms. In the preferred embodiment of the present invention, specific hardware platforms are vendor specific circuit boards designed to accommodate and support FPGAs. Specific hardware platforms generally provide power, data, and control interface connections, memory devices and other support circuits for use by the FPGA. Manufacturers of specific hardware platforms usually provide driver calls. These driver calls are program components that handle communication between the system board and external components. A portal is a communications interface comprised of a specific hardware platform and the associated interfaces to one or more FPGAs. The portal is, in turn, connected to a communication bus through which it receives control signals and inquiries and sends and receives data. If the design of the portal changes, however, the back end software construct must be re-written. Control signals and inquiries are generated by software applications running on other hardware devices. These control signals and inquiries make use of the driver calls provide by specific hardware platform manufacturers.

In the present invention, an improved method for permitting software applications to communicate with and control functional units is accomplished by using a software environment interface front end 12, a hardware device back end 16 that are designed according to the contract. In the preferred embodiment of the present invention, the contract negotiator is referred to as a Dynamic API. An API is an application programming interface which is a specification of a collection of methods available for use by software applications. A method is a software algorithm designed to perform a task.

In the present invention the contract negotiator is a non-static collection of methods advertised by hardware devices and implemented by software applications. In the preferred embodiment of the present invention, the contract negotiator comprises a specification of system calls to set and get attributes and read and write portals. The system calls are implemented by the DOM back end 16. FPGA portals are designed to have simple read/write interfaces. The contract negotiator uses a packet structure to communicate with these portals.

An additional system call implemented by the contract negotiator is an "allocate system" system call. In order to allocate a system through which software applications will perform functions, the contract negotiator requires a system specification file name as an argument. This file name points to a unique back end implementation and a library to parse the specification file. Requiring a specification file name as an argument allows different back ends 16 to have their own specifications which are unique to a specific hardware platform. By requiring that a back end assume responsibility for parsing a specification file, there is no limitation to the number of unique back end implementations.

The allocate system call returns an object representing the functional units of the system being allocated. The back end is responsible for providing a method for "attribute set" and another method for "attribute get" as part of the returned object. The attribute set method is used to set or change a functional unit's attributes. The attribute get method is used to query the current value of a functional unit's attributes. These methods and system calls are visible to and used by software applications. Once a request which has been generated by these methods and calls reaches the back end, the back end invokes the associated back end object. While functional unit specific information is invisible to the requesting software application, the back end object contains all the functional unit specific information to correctly stimulate the functional unit.

Dynamic Object Back End

Figure 2:
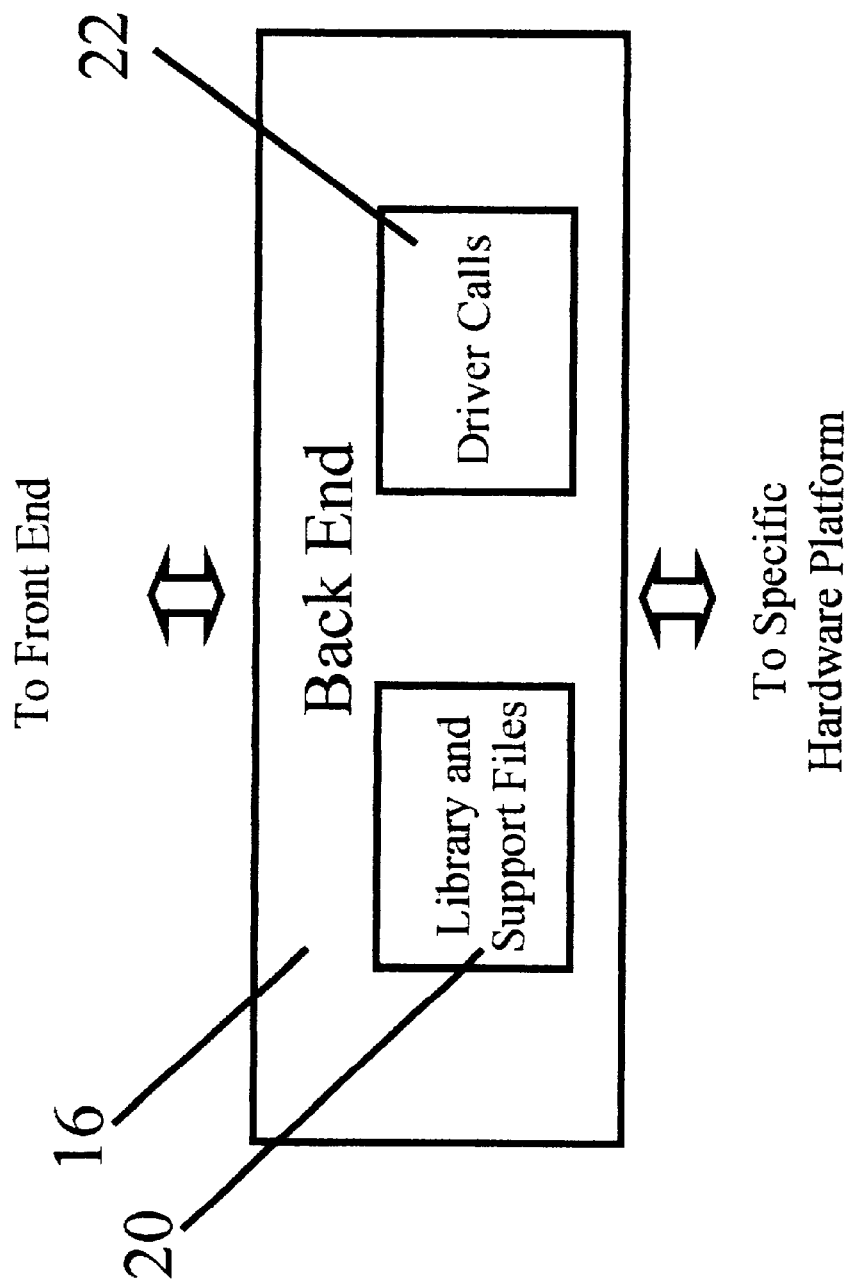
FIG. 2 is a block diagram illustrating a Dynamic Object Model back end according to the invention.

The DOM back end 16 is illustrated by the block diagram of FIG. 2. The back end is a software interface layer designed to connect a hardware device to a contract negotiator and implement system calls from the contract negotiator. The back end 16 is comprised of library and support files 20 and driver calls 22. The driver calls are specific software constructs provided by a specific hardware platform manufacturer. These driver calls respond to system calls issued by the contract negotiator and stimulate devices on the specific hardware platform which in turn stimulate inherent FPGAs, communicating with functional units through the FPGA portals. Each back end is uniquely written for each specific hardware platform.

When a system is allocated by the contract negotiator, the backend provides a library method to parse the requested specification file. Additionally, the back end returns a hierarchical Dynamic Object that represents the associated hardware device, its FPGA, and its functional units. The Dynamic Object is constructed by the back end in response to a contract negotiator system call and incorporates methods which encapsulate the associated functional units. Functional unit specific information is maintained by the back end library files, support files and driver calls. This allows for changing a design without changing the back end associated with the hardware device. Therefore, the back end is capable of returning Dynamic Objects which correctly represent the functionality of a design's functional units. The Dynamic Object comprises methods and parameters that represent the design architecture, wherein functional unit specific information such as timing delay and memory addressing is invisible to software applications.

In a second embodiment of the invention, a back end can be written to represent a software emulator instead of a hardware device. By using a software emulator, the entire DOM front end 12 can be developed and tested while a hardware device is under development. When the hardware device is complete, a back end 16 representing the hardware device is substituted for the back end 16 representing the software emulator without requiring changing software applications or the DOM front end 12.

Dynamic Object Front End

Figure 3:
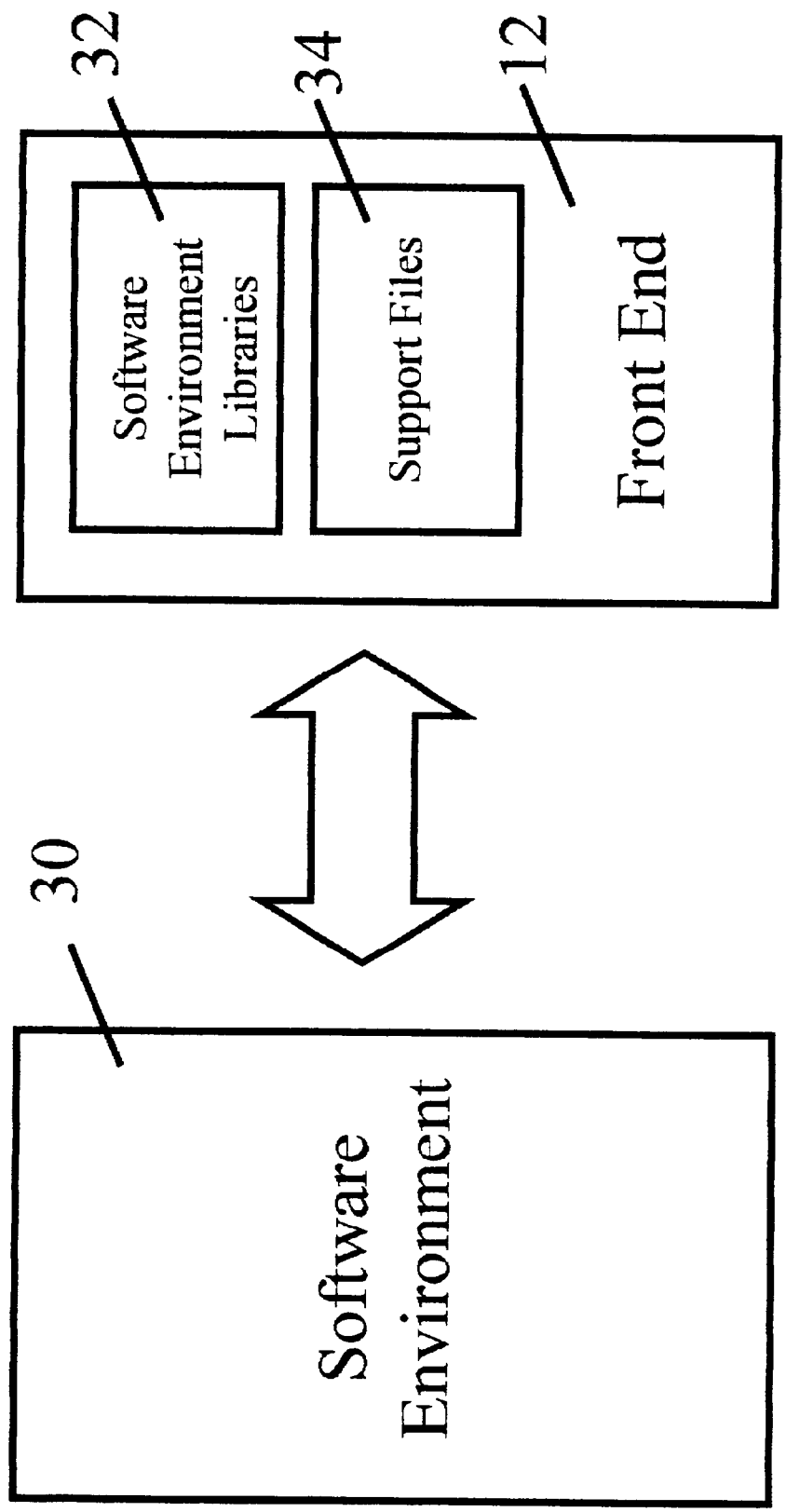
FIG. 3 is a block diagram illustrating a Dynamic Object Model front end according to the invention.

The DOM front end 12 is illustrated by the block diagram of FIG. 3. The front end is a software interface layer designed to support a software environment. Software environments are programming languages which support computer programs written as software applications. Each software environment has its own library and support files that uniquely defines the syntax and algorithmic approach available to software programmers. The front end 12 provides additional library file 32 and support files 34 to allow software applications written in a software environment to have access to the methods and parameters presented by the contract negotiator.

Each front end is written to support a specific software environment 30. The library files 32 and support files 34 are software environment specific and are developed independent of software applications. Once a front end 12 has been written, it need only be re-written if the specifications of the Dynamic API change. Changes to the DOM back end 16 do not affect the front end. This provides an interface layer which is independent of changes to software applications and hardware device alike.

This allows software programmers to write software applications that are not hardware device specific. Instead of including timing information and memory addressing in software applications, software programmers simply write programs which invoke the object representing the back end and use the associated methods to communicate with and control functional units. In the preferred embodiment of the invention, software programmers may use methods such as: (1) get attribute; (2) set attribute; (3) read portal; and (4) write portal. Each functional unit has a set of valid attributes which can be set or get and a set of portals which can be read from or written to. The attributes and portals wrapped with software environment information by the DOM front end 12 and provided for use to software applications.

Dynamic Object Model

Figure 4:
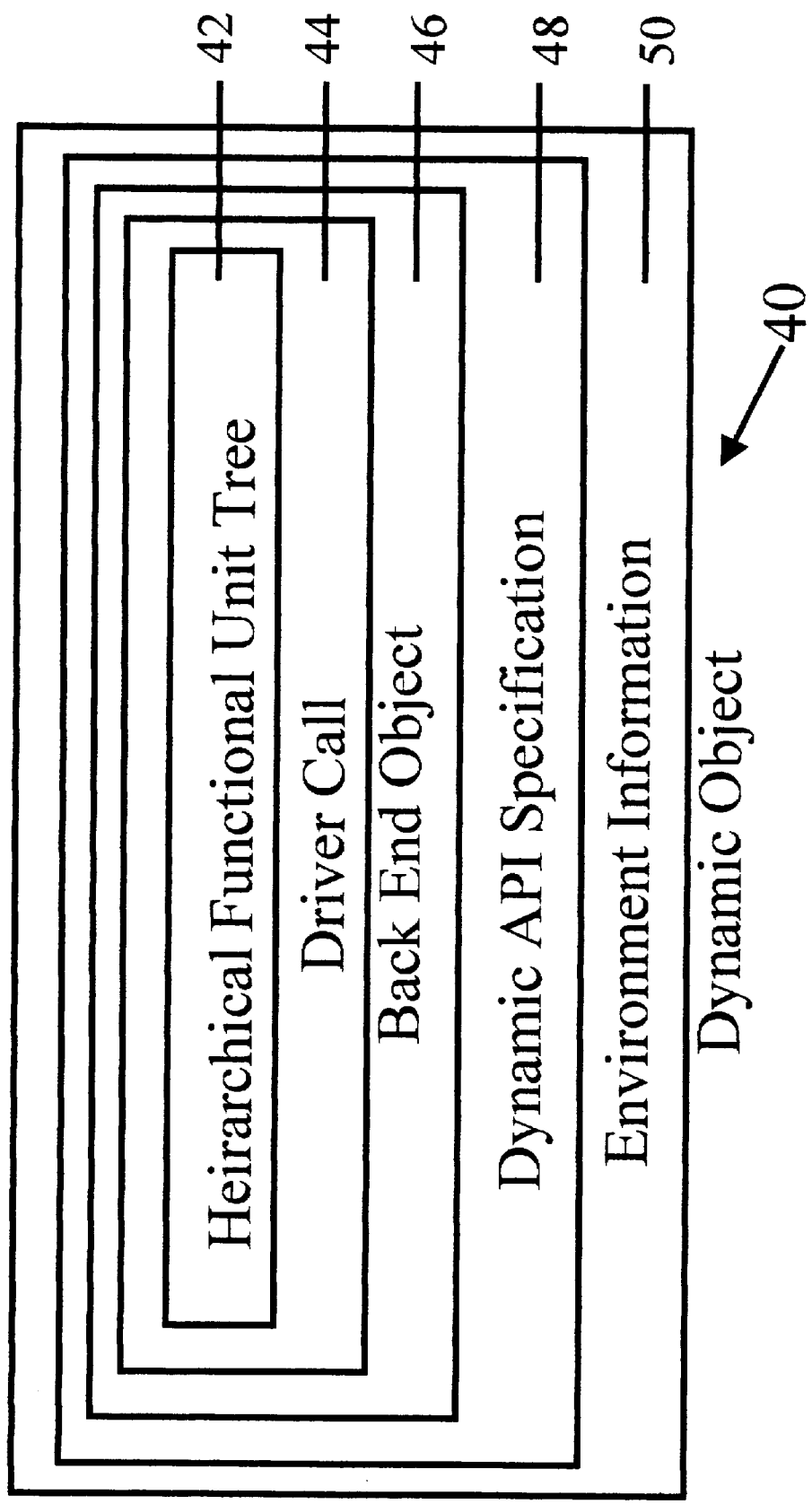
FIG. 4 is a block diagram of the elements of a Dynamic Object produced by the Dynamic Object Model according to the invention.

The construct which encapsulates the functional unit is called the Dynamic Object 40 illustrated in FIG. 4. A hierarchical functional unit tree 42 represents the functional units programmed into a PLD. The hierarchical functional unit tree is an abstraction that represents a hierarchy of functional units and FPGA portals. Specific hardware platform drivers 44 are used to stimulate the hierarchical functional unit tree 42. The DOM back end 16 parses the hierarchical functional unit tree 42 and drivers 44 and returns a back end object according to the contract. This back end object 46 possesses all the functional unit specific information to correctly stimulate the design's functional units. The contract negotiator accepts the back end object and matches it to a corresponding Dynamic Object according to the Dynamic API specification 48. The front end uses software environment information 50 to produce a Dynamic Object 40 according to the Dynamic API specification 48 and provides is for use by software applications.

To access a functional unit's attributes or ports, a software application invokes a Dynamic Object's 40 associated methods to change a parameter. For example, a functional unit which is designed as a signal processing tuner may have a frequency attribute. The back end 16 provides a back end object 46 which can get the value of or change the value of the tuner's frequency attribute. The contract negotiator accepts the set and get methods and the frequency attribute. The front end 12 produces a TUNER Dynamic Object 40 with a set/get method and associated frequency parameter.

A software application written in a software environment such as "C" or Matlab would simply invoke the Dynamic Object name, a Dynamic Object method and the associated parameter:

tuner.frequency=1500.

The invocation of the Dynamic Object 40 will activate the specific hardware platform drivers 44 which will stimulate the FPGA portals to set the tuner's frequency attribute to 1500.

Dynamic Object Model Example

Figure 5:
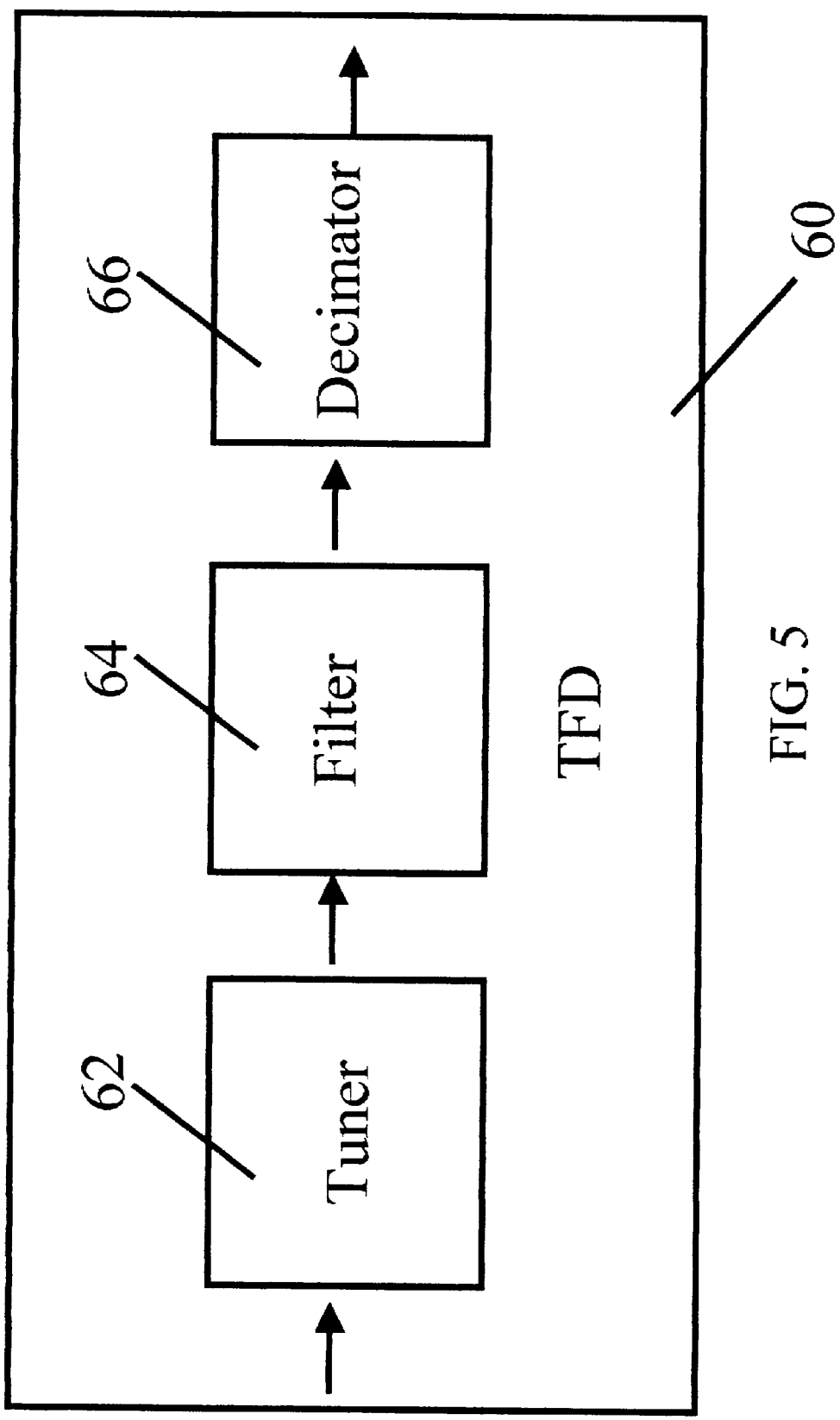
FIG. 5 is an illustration of a top level "Tuner/Filter/Differentiator" component exemplary of the invention.

A design example is shown in the block diagram of FIG. 5. A signal processing system called a TFD 60 comprises three functional units: a tuner 62, a filter 64, and a decimator 66. The tuner 62 has a frequency attribute, the filter has a taps attribute, and the decimator has an amount attribute. The TFD 60 has inputs and outputs that interface via external FPGA pins to the specific hardware platform.

Figure 6:
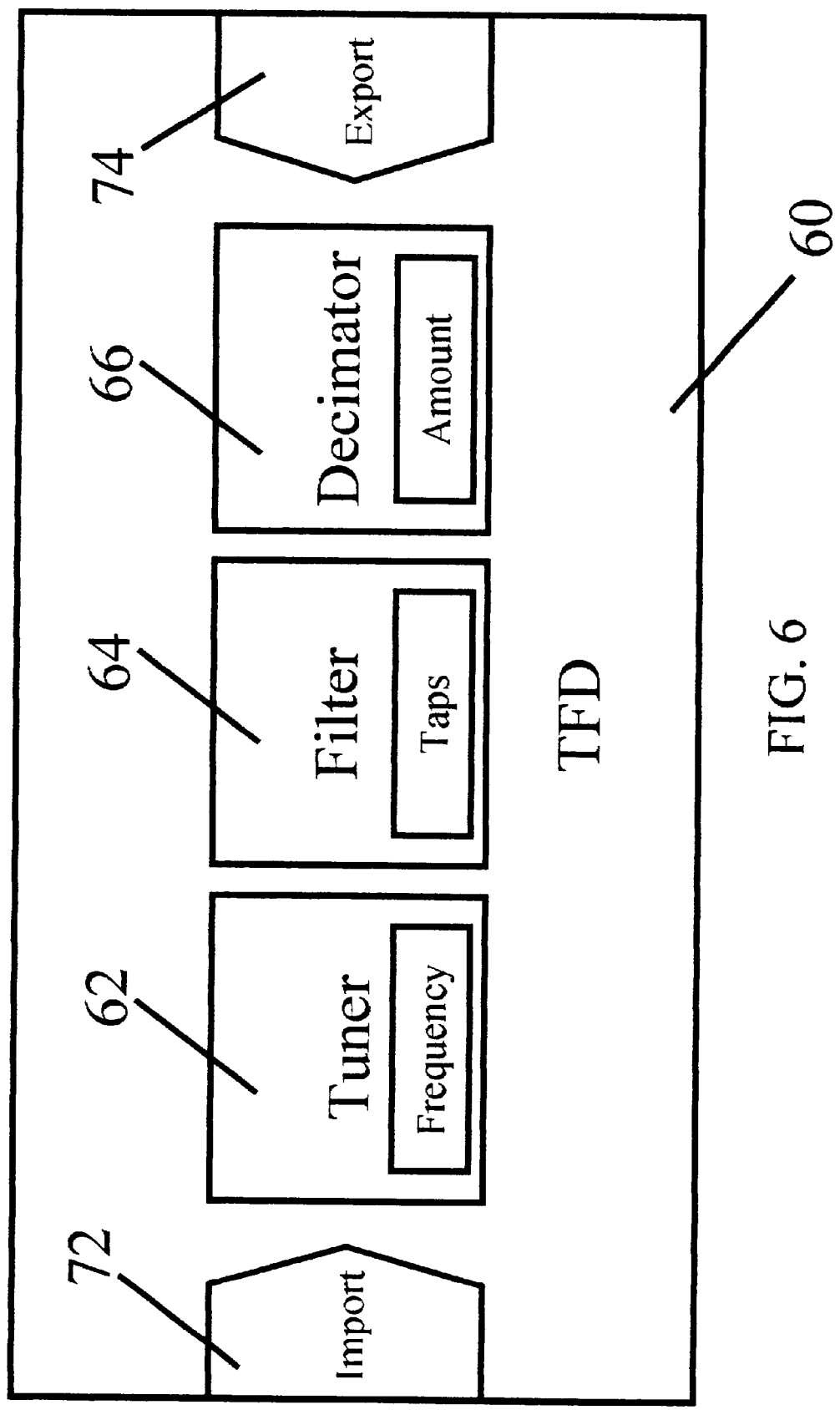
FIG. 6 is a block diagram of the top level component "Tuner/Filter/Differentiator" of FIG. 5 further illustrating portals exemplary of the invention.
Figure 7:
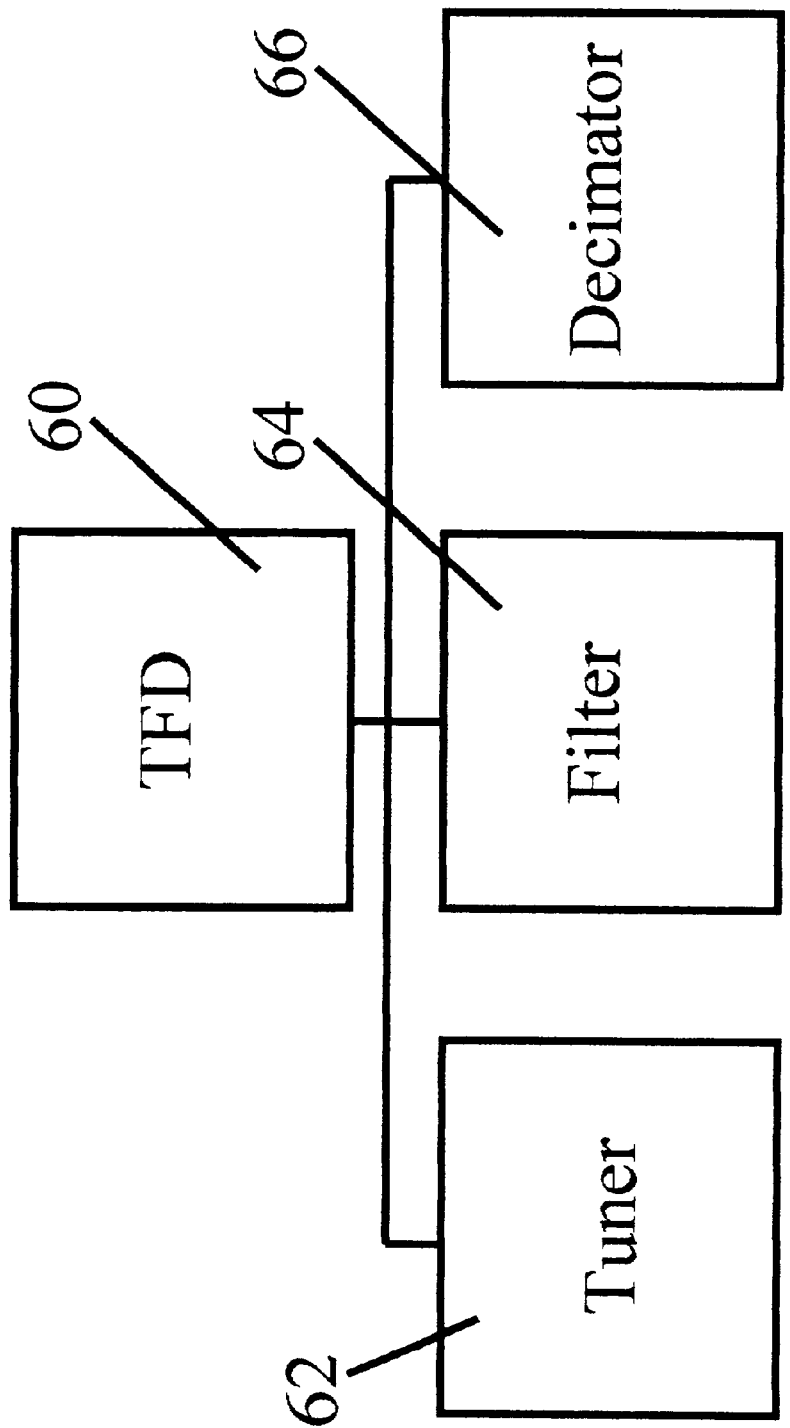
FIG. 7 is a block diagram illustrating the hierarchical component tree representative of the top level "Tuner/Filter/Differentiator" component of FIG. 5.

In this example, the specific hardware platform is an Annapolis MicroSystems Starfire card and the FPGA is manufactured by Xilinx. As the TFD processes information, its attributes may be dynamically changed by requests from software applications. In this example, the software application is a computer program written in the Midas 2k software environment. FIG. 6 illustrates the TFD 60 with associated import portal 72 and export portal 74. FIG. 7 is a block diagram of the hierarchical component tree 80 representing the TFD 60 and its associated functional units 62, 64 and 66.

The TFD hierarchical component tree 80 is implemented as a node that contains a component specification file by a back end 16 written specifically for the Annapolis Micro-Systems Starfire board. The component specification file describes the functional units' attributes, and the FPGA portals. Attribute addresses are generated by the back end 16. A functional unit may have numerous attributes such as address, size, depth, initial value, and writing source (either hardware, software, or both). Functional unit attribute addresses are relative to the address of the top level component, the TFD 60. These attribute addresses are maintained by the back end 16 but are not reported to the front end 12 or a software application.

Figure 8:
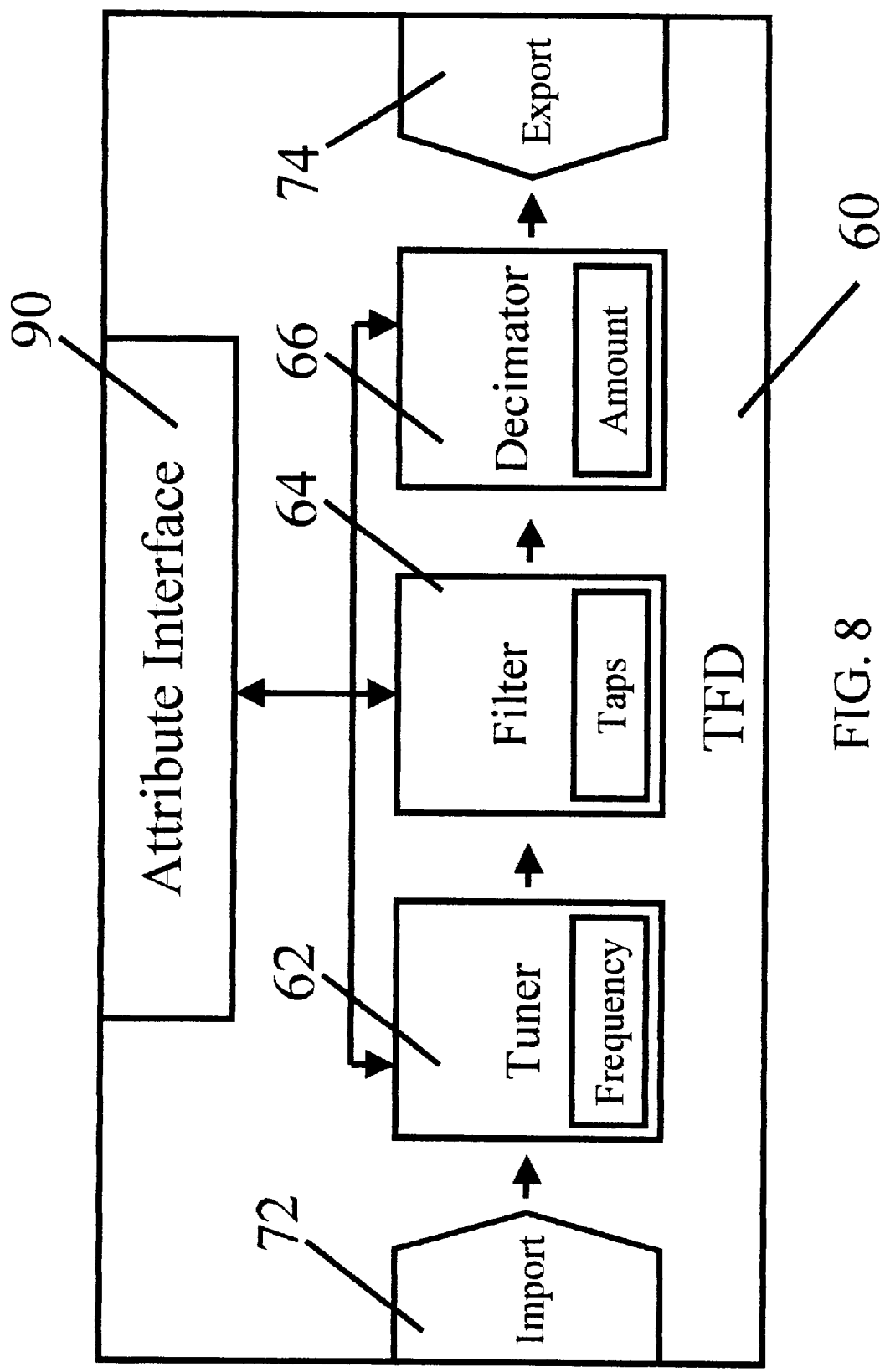
FIG. 8 is an illustration of a sample component specification file for the top level "Tuner/Filter/Differentialtor" component of FIG. 5.

FIG. 8 shows a component specification file for the top level component TFD 60. The TFD 60 has an attribute interface 90 through which communication and control requests pass to the functional units 62, 64, and 66. This attribute interface 90 is represented as an abstract portal. Abstract portals are mapped to a specific platform portal associated with the Starfire hardware platform by the DOM back end 16. By using an abstract portal, changing the FPGA design does not require that its abstract portal be re-mapped so long as the design remains on the originally specific hardware platform.

The back end 16 produces a container 42 that encapsulates the TFD 60, its portals 72,74, its functional units 62, 64, 66, and its attributes. Drivers 44 provided by the board manufacturer are used to produce methods 46 that will stimulate the TFD 60 to get or set the value of its attributes or read or write to its portals. The Dynamic API consists of calls or dynamic API methods to allocate a system, set and get functional unit attributes, and write and read functional unit portals. The DOM front end 12 takes the dynamic API methods, parses Midas 2k software environment libraries and support files and returns a Dynamic Object that can be accessed by the Midas 2k software application.

By using the Dynamic Object Model interface layer, applications can be built that have no dependence on the underlying FPGA platform and can be used with a plurality of specific hardware platforms. Inserting a hardware device into a different software environment can also be done with relative ease.

While the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent products. The present invention is not limited by these embodiments of FPGAS, PLDs, specific hardware platforms, or software applications.

I claim:

1. A digital storage medium for use with a computer system, comprising:
    a back end program component for producing a back end object representative of a functional unit, said back end object possessing functional unit specific information; and
    a front end software program component for producing a front end object, wherein said front end object is responsive to requests from software applications to perform functions and to set parameters of said back end object without utilizing said functional unit specific information, and wherein said front end object uses said back end object according to a dynamic list of acceptable system calls, said dynamic list of acceptable system calls comprising a standard set of acceptable functions and parameters defining a communication protocol.

2. The digital storage medium of claim 1, wherein said functional unit is incorporated in a hardware device.

3. The digital storage medium of claim 1, wherein said functional unit is a software emulator.

4. The digital storage medium of claim 2, wherein said hardware device is a system board.

5. The digital storage medium of claim 4, wherein said system board comprises a programmable logic device.

6. The digital storage medium of claim 5, wherein said programmable logic device is a field programmable gate array.

7. The digital storage medium of claim 5, wherein said hardware device further comprises a specific hardware platform.

8. The digital storage medium of claim 7, wherein said back end program component is adopted for a distinct specific hardware platform.

9. The digital storage medium of claim 8, wherein use of a different type of programmable logic device will not necessitate changes to said back end program component.

10. The digital storage medium of claim 9, wherein changes to said back end program component are necessary only when said dynamic list of acceptable system calls is modified, said type of programmable logic device is changed, said specific hardware platform is changed, or driver calls designed to support the specific hardware platform are modified.

11. The digital storage medium of claim 8, wherein an alternative back end program component is implemented without changing said front end program component or said software applications.

12. The digital storage medium of claim 1, wherein said front end program component is written to accommodate a specific software environment.

13. The digital storage medium of claim 12, wherein changes to said software applications do not necessitate a change in said front end program component.

14. The digital storage medium of claim 12, wherein changes to said front end program component are necessary only when said dynamic list of acceptable system calls is modified.

15. The digital storage medium of claim 14, wherein said front end program component is modified without changing said back end program component.

16. A method for allowing software applications to communicate with and control a functional unit, comprising:
producing a back end object representative of said functional unit, wherein said back end object incorporates functional unit specific information and is produced according to a dynamic list of acceptable system calls, said dynamic list of acceptable system calls comprising a standard set of acceptable functions and parameters defining a communication protocol; and
producing a front end object responsive to software application requests to perform functions and to set parameters of the back end object without utilizing said functional unit specific information, wherein said front end object uses said back end object according to said dynamic list of acceptable system calls.

17. The method of claim 16, further comprising incorporating said functional unit in a hardware device.

18. The method of claim 16, further comprising emulating said functional unit with software.

19. The method of claim 16, further comprising incorporating said functional unit in a system board.

20. The method of claim 16, further comprising incorporating said functional unit in a programmable logic device.

21. The method of claim 16, further comprising incorporating said functional unit in a field programmable gate array.

22. The method of claim 20, further comprising incorporating said functional unit in a specific hardware platform.

23. The method of claim 22, further comprising providing a distinct back end object for each of a plurality of distinct specific hardware platforms.

24. The method of claim 23, further comprising implementing a different type of programmable logic device without changing said back end object.

25. The method of claim 24, further comprising changing the back end program component only when said dynamic list of acceptable system calls is modified, the type of programmable logic device is changed, said specific hardware platform is changed, or driver calls designed to support the specific hardware platform are modified.

26. The method of claim 23, further comprising implementing an alternative back end object without changing said dynamic list of acceptable system calls, said front end object, or said software applications.

27. The method of claim 16, further comprising producing a distinct front end object for each of a plurality of software environments.

28. The method of claim 27, further comprising modifying said software applications without modifying said front end object.

29. The method of claim 27, further comprising modifying said front end object only when said dynamic list of acceptable system calls is modified.

30. The method of claim 29, further comprising modifying said front end object without modifying said dynamic list of acceptable system calls or said back end object.

31. A digital storage medium for use with a computer system, comprising:
a back end program component for producing a back end object representative of a functional unit, said back end object possessing functional unit specific information;
a front end program component for producing a front end object, wherein said front end object is responsive to requests from software applications to perform functions and to set parameters of said back end object without utilizing said functional unit specific information; and
a dynamic application program interface component for providing a dynamic list of acceptable system calls, said dynamic list of acceptable system calls comprising a standard set of acceptable functions and parameters defining a communication protocol.

* * * * *